United States Patent [19]

Igarashi

[11] 4,156,810

[45] May 29, 1979

[54] TRANSMITTING DEVICE OF LIGHT SIGNAL FOR REMOTE CONTROL

[75] Inventor: Shigemi Igarashi, Tokyo, Japan

[73] Assignee: Sato Koki Company Limited, Tokyo, Japan

[21] Appl. No.: 842,528

[22] Filed: Oct. 17, 1977

[30] Foreign Application Priority Data

Jan. 31, 1977 [JP] Japan .................. 52-010097

[51] Int. Cl.² .............................................. B22D 7/10
[52] U.S. Cl. ........................................ 250/199; 325/37;
    325/392; 343/225; 358/194
[58] Field of Search ............... 358/194, 210; 250/199;
    343/225; 325/37, 392

[56] References Cited

U.S. PATENT DOCUMENTS

| 1,430,902 | 10/1922 | Hammond | 343/225 |
|---|---|---|---|
| 3,534,351 | 10/1970 | Harnden | 250/199 |
| 3,814,509 | 6/1974 | Miano | 358/237 |
| 3,866,177 | 2/1975 | Kawamata | 343/225 |
| 3,949,297 | 4/1976 | Hideshima | 358/194 |
| 3,971,028 | 7/1976 | Funk | 343/225 |

*Primary Examiner*—Robert L. Griffin
*Assistant Examiner*—Edward L. Coles
*Attorney, Agent, or Firm*—Donald D. Mon

[57] ABSTRACT

A transmitting device of light signal for remote control of television channel, sound volume, radio, tape recorder, etc, to transmit a light signal to a receiving device which is provided in the device which is to be controlled. Said light signal has at least two light pulses, i.e. first, and a second pulse and time interval Tp between said first, and a second light pulse which differs according to an operated switch, i.e. controlling matter. A delaying circuit is provided between the circuit of the switch and a gate circuit of a thyristor for producing said secondary light pulse so as to avoid controlling the gate of thyristor during an unstable condition immediately after the operation of said switch.

2 Claims, 3 Drawing Figures

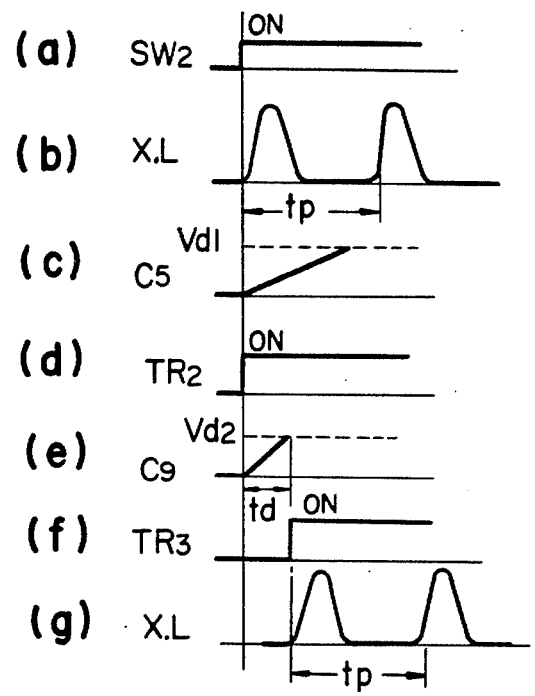
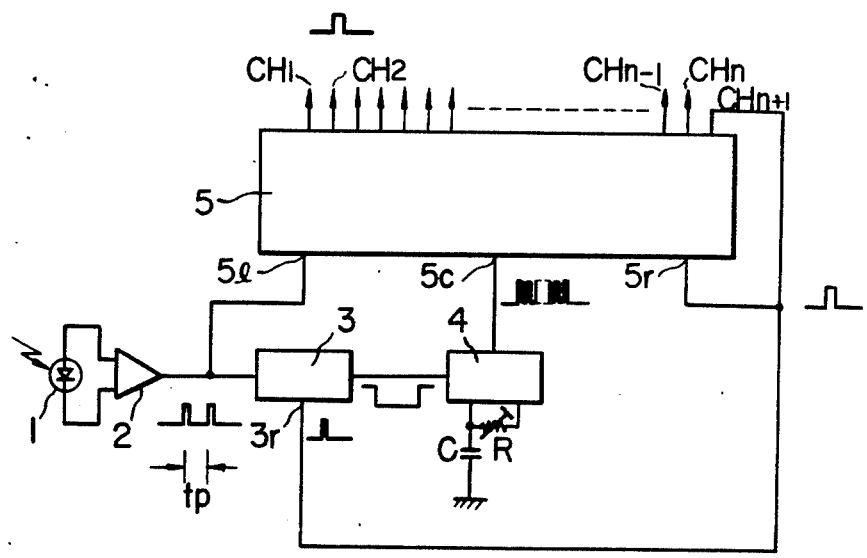

TRANSMITTING DEVICE OF LIGHT SIGNAL FOR REMOTE CONTROL

BACKGROUND OF THE INVENTION

The present invention relates to a transmitting device of light signal for remote control of sound volume, channel of television, radio, taperecorder, etc.

In said device, the light signal has at least two light pulses, i.e. first and second pulse. The time interval between the first and second pulse differs according to an operated switch and the transmitting device transmits different light signals according to control or selecting matter.

The device to be controlled by this light signal has a receiving device, which distinguishes the light signals by the difference of time interval between the first and second pulse and produce an output signal for controlling. Thus a desired remote control is attained.

Generally, in this electric circuit, the electrical state immediately after the operation of the switch is unstable and has a tendency to make error in operation. Therefore, control of the gate of the thyristor becomes inaccurate and accurate and stable remote control is impossible.

An object of the invention is to eliminate said drawback and provide a transmitting device of light signal of accurate and stable operation.

BRIEF SUMMARY OF INVENTION

The object of present invention is to provide a transmitting device of light signal for remote control in which a delaying circuit is provided between the circuit of the switch and the gate of the thyristor so as to avoid controlling the gate of the thyristor during the unstable condition immediately after the operation of switch.

BRIEF DESCRIPTION OF THE DRAWING

In the drawing

FIG. 2 shows time charts for explaining the operation of said device.

FIG. 3 is a block circuit of receiver according to the present invention.

DETAILED DESCRIPTION

Figure 1:
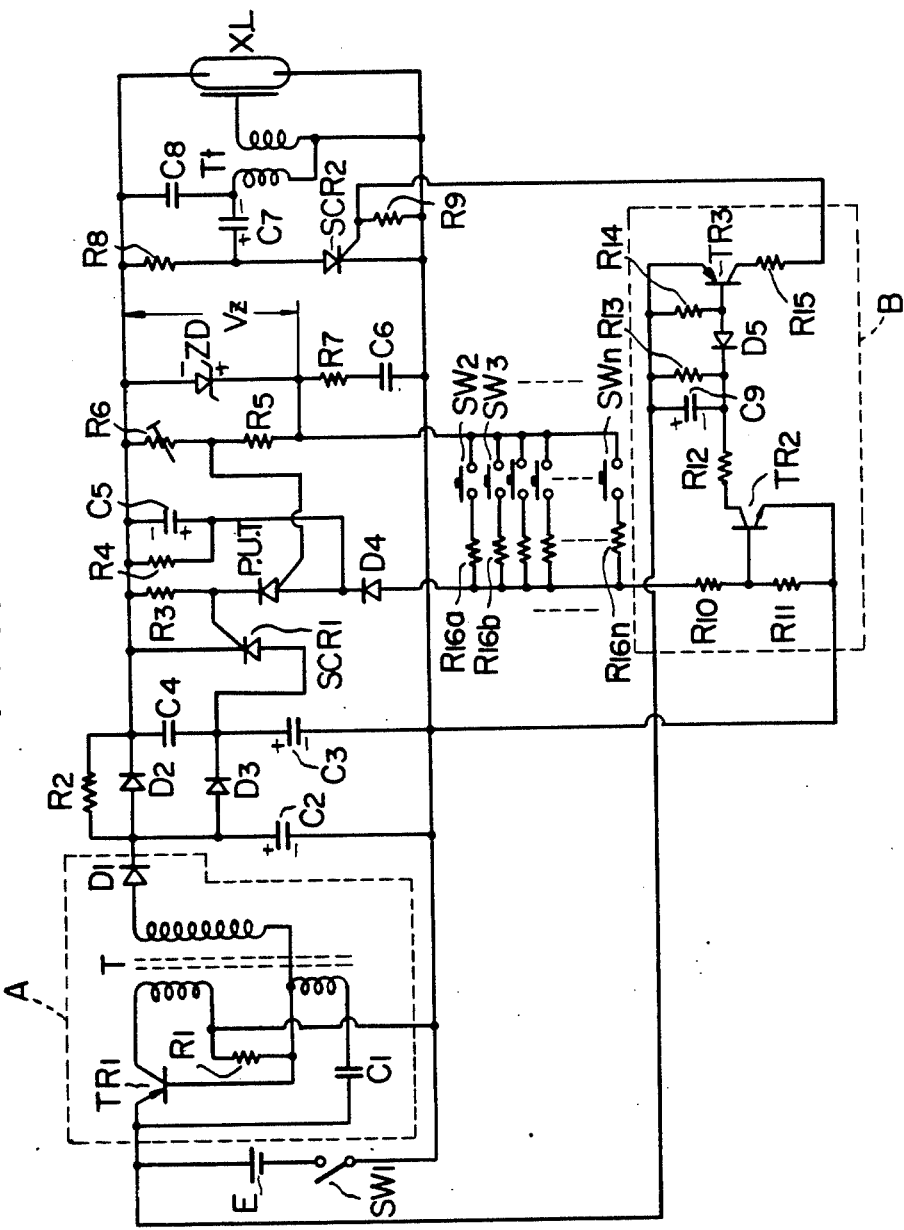
FIG. 1 is a circuit of transmitting device according to an embodiment of present invention.

Referring to FIG. 1, we explain transmitting device of light remote control in the present invention.

Upon the closing of electric power switch SW1, DC-DC converter A generates DC voltage, and first and second light emission condenser C2,C3, charge condenser C6 via zener diode ZD, trigger condenser C7 via resistor R8 and primary coil of trigger transformer Tt are charged respectively in the polarity shown in the Figure.

When the operator turns one of switch SW2...SWn, for example SW2, ON as showntime chart a in FIG. 2, and if the delaying circuit B which is gist of present invention does not exist and instead a direct connection, electric charges of charge condenser C6 flow through switch SW2, resistor R16a and R9 and trigger thyristor SCR2 turns ON by the voltage of resistor R9, the electric charges of trigger condenser C7 discharge through primary coil of transformer Tt, and pulse generated at secondary coil of transformer Tt triggers light emission lamp XL such as a xenon tube. As the result, electric charges of first condenser C2 discharge through diode D2 and light emission lamp XL, and the first light emission (pulse) is performed as shown in FIG. 2b.

Simultaneously, electric charges of charge condenser C6 discharge through zener diode ZD and light emission lamp XL. Zener diode produces zener voltage Vz as shown in FIG. 1. By this zener voltage Vz, electric current flows through switch SW1, resistor R16a, diode D4 and condenser C5, the operation condenser C5 is charged in the polarity as shown in FIG. 1 by the time constant determined by resistance of R16a and capacitance C5 as shown FIG. 2c. On the other hand, said zener voltage Vz is divided by resistor R5, R6, and added to the gate of unijunction transistor P.U.T.

The voltage of operation condenser C5 reaches to a trigger voltage Vd1 of transistor P.U.T. and turns it ON, the electric charges of operating condenser C5 discharge through transistor C5 and R3, the voltage generated at resistor R3 turns thyristor SCR1 ON and electric charges of condenser C3 discharge through thyristor SCR 1 and light emission lamp XL and secondary light emission is performed. At the same time a part of the electric charges of condenser C3 discharge through condenser C8 and the primary side of transformer Tt, so as to trigger the light emission lamp XL by the pulse generated at secondary side of said transformer Tt and assures the emission of lamp XL to emit the second pulse.

If we change the one of switch SW2... SWn to be operated, the time constant determined by the resistance of selected R16a... R16n and capacitance of operating condenser C5 varies and the interval Tp between the first and second pulse of the resulting light signal shown FIG. 1b, differ according to the operated switch SW2... or SWn.

However, generally the electrical state of the circuit immediately after the operation of switch SW2... SWn is unstable and the gate control of trigger thyristor becomes inaccurate. Thus accurate and stable remote control is impossible.

The present invention intends to eliminate said drawback and enables accurate and stable operation by avoiding controlling the gate of the trigger thyristor during said unstable condition of the circuit. In the present invention said controling the gate of thyristor is performed at the stable condition of the circuit.

As shown in FIG. 1, a delaying circuit B is provided between the circuit of switch SW2... SWn and the circuit of gate of thyristor for avoiding triggering the gate of thyristor at said unstable condition.

The delaying circuit, for example, consists of the first switching transistor TR2, base resistors R10... R11, delaying resistor R12 and condenser C9 for collector circuit, secondary transistor circuit TR3, resistor R3,R14 and diode D5 of the base circuit, and collector resistor R15.

When the operator turns the switch SW2 ON as shown FIG. 2a, as explained before, electric charges of charge condenser C6 flow through switch SW2, resistor R16b, R10, R11, the voltage produced at the resistor R11 triggers transistor TR2 as shown in FIG. 2(d) and transistor TR2 turns ON. As the result, electric current flow through delaying condenser C9, resistor R12, collector and emitter of transistor TR2 from DC electric source E, and delaying condenser C9 is charged by the time constant determined by the value of C9 and R12 as shown FIG. 2e. Thus the voltage of condenser C9 reaches to a voltage Vd2 which is the operating voltage of transistor TR3, transistor TR3 turns ON as shown FIG. 2(f) the voltage produced at resistor R9 turns the trigger thyristor SCR2 ON, and secondary light emission (second pulse) following said first light emission (first pulse) is performed as explained and shown in FIG. 2(g).

In this case, the gate signal for triggering thyristor SCR2 is added after delaying time Td (R12 × C9 = time constant of delaying circuit B) from the ON of switch SW2, ... or SWn by delaying circuit B and thus enabled to control the gate of thyristor SCR2 for avoiding the period which is in an electrically unstable condition immediately after the ON of switch SW2 ... SWn.

A transmitting device according to the present invention is used for controlling many kinds of devices from remote location such as turning of television channels, and ON OFF operation of a power switch.

FIG. 3 shows an example of a receiving device for a television picture receiver.

The first and second pulses of light signal emitted from the transmitting device are received by photo receiving element 1, amplified and normalized by amplifier circuit 2 and transduced into pulse signal as shown in FIG. 3.

3 is a flip-flop circuit, 4 is a pulse oscillator to oscillate by predetermined frequency, 5 is a counter latch circuit, monostable multivibrator, decoder etc. which are assembled in IC element. CH1, ... CHn+1 are output terminals of said IC element 5, 51 is an input terminal for latching, 5c is an input terminal for counting, 5r is a input for reset.

When the first pulse signal is added to flip-flop circuit 3, said pulse oscillator 4 begin to start the oscillation by the first pulse signal, and generate a pulse of predetermined frequency. The first pulse signal is added to latch input terminal 51, but an output signal is not produced from output terminal CH1 ... CHn+1, because this pulse is not added to the counter of IC element 5. If the pulse from pulse oscillator 4 is added to the counter of IC element 5 through input terminal 5c, then the counter begins counting. If the second pulse signal is not given to the circuit, said output terminal CHn+1 produces a reset pulse at a predetermined time after the first pulse, and said counter of IC element 5 and flip-flop circuit 3 is reset and return to initial condition.

If the second pulse signal is added to said flip-flop circuit 3, the oscillation of pulse oscillator 4 is stopped. As soon as the pulse to be added to the counter of IC element 5 does not exist, the secondary pulse is added to latch input terminal 51, and latching operation is performed and one of the output terminals CH1, ... CHn, for example CH2 which corresponds to the counted number of counter of IC element 5, produces an output pulse and desired channel of television, for example 2 channel is selected by said output signal from terminal CH2.

As explained above, upon the operation of power switch SW1 and switch SW2, ... SWn which correspond to desired channel or volume of sound etc, in the transmitting device, a light signal consisting of the first and second pulse which interval Tp corresponds to operated switch SW1, ... SWn, i.e., controlling matter, is emitted from said transmitting device to the receiving device, and desired remote control is attained.

In the present invention, a delaying circuit is provided between the circuit of switch and circuit of the gate of thyristor, and the controlling of the gate of gate of thyristor is performed at an electrically stable condition, which enables it to emit a stable and accurate light signal, and to perform stable and accurate remote controlling.

What is claimed is:

1. A transmitting device of light signal for remote control in which a trigger thyristor turns ON upon the operation of one of switches for transmitting and electric charges charged in trigger condenser discharge through the primary side of a trigger transformer, pulse generated at the secondary side of said trigger transformer light arc emission lamp so that the electric charges of first light emission condenser discharge through said light emission lamp to perform the first light emission, and electric charges of a charge condenser discharge through a zener diode and said light emission lamp, a zener voltage produced at said zener diode charges an operating condenser by the time constant determined by a selected element through said operated switch, and upon the reaching of the voltage of said operating condenser to a trigger voltage of a transistor, the transistor and thyristor for secondary light emission turn ON and the electric charges of second light emission condenser discharge through said thyristor for secondary light emission and light emission lamp to perform a second light emission following the said first light emission, characterized in that a delaying circuit is provided between the circuit of the switch and the circuit of the gate of the trigger thyristor so as to avoid controlling the gate of thyristor during unstable electric condition immediately after the operation of said switch.

2. In a system for transmitting a signal in the form of at least two pulses of light for remote control of a receiving device which is adapted to distinguish said signal by the time difference between a first and a second of the light pulses, said system being of the type comprising:
   a light emission lamp;
   a source of voltage;
   a first light emission condenser charged from said voltage source;
   a second light emission condenser charged from said voltage source;
   a trigger thyristor having a gate which causes the thyristor to become conductive upon application of voltage from said source to it;
   a trigger condenser in circuit with said thyristor and the lamp, said trigger condenser being charged through the conductive trigger thyristor so that the trigger condenser discharges through the lamp and the first light emission condenser, whereby the last-mentioned condenser discharges through the lamp to produce a first light pulse;
   a zener diode;
   a charge condenser charged from said voltage source through said zener diode so that the charging current to the charge condenser develops a voltage across said zener diode;
   an operation condenser, a resistor means and a switch means in series with each other, connected across the zener diode so that operation condenser charges to the trigger voltage of the trigger thyristor at a rate established by the time constant of said resistor and operation condenser;
   said trigger thyristor being connected in circuit with said operation condenser so as to become conductive at said trigger voltage, whereupon the trigger condenser again charges and discharges through the lamp causing the second light emission condenser to discharge through the thyristor and the lamp to produce a second light pulse;
the improvement comprising:
a time delay circuit between the gate of the thyristor and the switch means to prevent the trigger voltage from arriving at the gate of the thyristor until the system has arrived at a state of stability.

* * * * *